United States Patent [19]

Kaja et al.

[11] Patent Number: 5,382,447
[45] Date of Patent: Jan. 17, 1995

[54] PROCESS FOR FABRICATING IMPROVED MULTILAYER INTERCONNECT SYSTEMS

[75] Inventors: Suryanarayana Kaja, Hopewell Junction; Eugene J. O'Sullivan, Nyack; Alejandro G. Schrott, New York, all of N.Y.

[73] Assignee: International Business Machines Corporation, Armonk, N.Y.

[21] Appl. No.: 161,764

[22] Filed: Dec. 2, 1993

[51] Int. Cl.⁶ .............................................. B05D 5/12
[52] U.S. Cl. ................................. 427/126.6; 427/343; 427/385.5; 427/419.2; 427/443.1
[58] Field of Search ............. 427/443.1, 126.6, 343, 427/385.5, 419.2

[56] References Cited

U.S. PATENT DOCUMENTS

| | | | |
|---|---|---|---|
| 4,770,899 | 8/1988 | Zeller | 427/96 |
| 5,112,462 | 5/1992 | Swisher | 427/322 |
| 5,151,304 | 9/1992 | Lee | 427/306 |
| 5,156,732 | 10/1992 | Ogasawara et al. | 205/126 |
| 5,288,519 | 2/1994 | Baumgartner et al. | 427/443.1 |

*Primary Examiner*—Shrive Beck
*Assistant Examiner*—Benjamin L. Utech
*Attorney, Agent, or Firm*—Perman & Green

[57] ABSTRACT

The invention provides a multilayer laminar interconnect package comprising a plurality of conductor circuit layers adhering to and sandwiched between a plurality of dielectric polyimide polymer layers where the conductor circuit layers are a circuit pattern of lines of conductive metal. The conductive metal, e.g. copper, is coated with a capping layer of a metal, e.g. cobalt, which capping layer is further characterized as having a thin layer of the capping metal oxide adhered to the surface thereof. The conductive layer is in contact with an overcoated polyimide dielectric layer such that the surface oxidized capping layer forms an adherent barrier layer at the interface of the polyimide and conductive line layers. The invention also provides a process for producing such interconnect packages.

16 Claims, 1 Drawing Sheet

PROCESS FOR FABRICATING IMPROVED MULTILAYER INTERCONNECT SYSTEMS

BACKGROUND OF THE INVENTION

1. Field of the Invention

The present invention relates to improved multilayer interconnect systems having conductive circuit layers adhering to and sandwiched between polyimide dielectric layers, and a process for fabricating same.

2. Description of Related Art

High-performance mainframe computers require a very high density interconnect system to take advantage of high speeds of the integrated circuits currently available. These interconnect systems are normally fabricated using multilayer thin film technology to produce a plurality of conductor circuit planes or layers containing a circuit pattern of conductive metal lines, e.g. copper metal lines, sandwiched between and adhered to a plurality of dielectric planes or layers which can be ceramic layers, layers of polyimide polymer or combinations of such layers.

Multilayer interconnect systems which utilize polyimide polymers as the dielectric insulating layer are generally prepared by well known processes. A thin film of conductive metal, e.g. copper, is deposited on the surface of a substrate layer which may be a polymeric film, e.g. polyimide, or a dielectric ceramic. The metal layer is then coated with a thin film of photoresist, followed by exposure of the resist film to a patterned source of light or energy. Subsequent development of the resist leaves exposed metal and resist-masked metal lines which will form the circuit pattern. Exposed metal is then selectively etched away using a suitable etchant, and the resist mask is subsequently removed by known techniques leaving a circuit pattern of conductive metal lines adhered to the substrate.

Laminar structures are prepared by coating the surface of the circuit structure prepared as above with a polyimide precursor material, e.g. a polyamic acid, to form a thin overcoating film layer which contacts both the exposed substrate and the circuit pattern. The precursor is then cured by heating the assembly at a temperature up to 450° C. which results in the formation of a dielectric layer comprising the polyimide condensation product. The above described process is then repeated one or more times by forming additional layers of conductive metal on the surface of the polyimide polymer dielectric layer, patterning and etching this layer as described above, and further overcoating the patterned conductive layer with polyimide precursor material, curing the precursor material, and so forth.

The use of polyimide polymer as the dielectric layer in such constructions offers the advantages of ease of fabrication and the provision of a smooth dielectric surface which facilitates the development of a multi layer, dense laminar package having many alternating layers of dielectric and metal conductors stacked one on top of the other.

One problem with respect to such a package construction is that some conductive metals, such as copper, chemically interact when in contact with polyamic acids resulting in the development of a copper complex with the free carboxylic acid group present on the polyamic acid chain, likely catalyzed by the generation of water of hydration during the condensation reaction from the polyamic acid stage to the cured polyimide stage. This interaction produces a phenomenon on the interfacial surfaces between the copper conductors and polyimide which significantly reduces or destroys the electrical properties of the package, a particularly serious problem where the interconnect system is of very high conductor density. Corrosion of the copper conductors can result in electrical shorts and/or delamination of the sandwich structure.

One approach to the solution of this problem is to sputter a capping layer of a relatively inert metal, such as chromium, over the surface of the copper line interconnects during fabrication of the laminar interconnect package, which capping layer serves to chemically insulate the copper from contact with the later-applied polyamic acid precursor. However, sputter application of a chromium layer is non-selective and therefore requires additional lengthy patterning and etching steps which add significantly to cost.

Another approach toward the solution of this problem is disclosed in U.S. Pat. No. 4,770,899, which teaches electroless deposition of an inert capping metal layer selectively on the surfaces of copper conductors. The capping metal is preferably nickel or cobalt and serves to chemically insulate the copper and the polyamic acid precursor. One problem with the approach is that such electrolessly deposited metals exhibit significantly less adhesion with respect to polyimide films formed on their surfaces than do metals such as chromium, thereby leading to a prospect of laminar adhesion failures at the interface of the copper conductor and polyimide layers.

Accordingly, it is a primary object of this invention to prepare a multilayer laminar interconnect package wherein conductive metal line components of conductive layers are chemically insulated from overlying polyimide dielectric layers and which exhibit enhanced adhesion at the interface of the conductors and polyimide dielectric layers.

SUMMARY OF THE INVENTION

The primary object of the invention is achieved by the provision of a multilayer laminar interconnect package comprising a plurality of conductor circuit layers adhering to and sandwiched between a plurality of dielectric polyimide polymer layers where the conductor circuit layers are a circuit pattern of lines of conductive metal. The conductive metal, e.g. copper, is coated with a capping layer of a metal, e.g. cobalt, which capping layer is further characterized as having a thin layer of the capping metal oxide adhered to the surface thereof. The conductive layer is in contact with an overcoated polyimide dielectric layer such that the surface oxidized capping layer forms an adherent barrier layer at the interface of the polyimide and conductive line layers.

The invention provides an improved process for fabricating such a multilayer interconnect package comprising:

a) forming a circuit pattern of conductive metal lines on a substrate;

b) electrolessly depositing a capping metal layer on the surface of said pattern of conductive metal lines, the capping metal characterized as being essentially chemically inert when in contact with a polyimide precursor;

c) subjecting said capping metal layer to oxidative conditions to form a thin layer of capping metal oxide adhered to the surface of said capping layer;

d) forming a uniform coating of a polyimide precursor material on a planar surface of said substrate to overcoat said substrate and said circuit pattern, thereby forming a laminar structure;

e) heating said laminar structure to cure said polyimide precursor material, thereby forming a polyimide surface;

f) forming a second circuit pattern of conductive metal lines on the polyimide surface of said laminar structure produced in step (e); and g) repeating steps (b) through (e).

The invention results in the provision of improved multilayer high density interconnect packages for use in integrated circuits having enhanced quality and lower production costs.

DETAILED DESCRIPTION OF THE INVENTION

Figure 1:
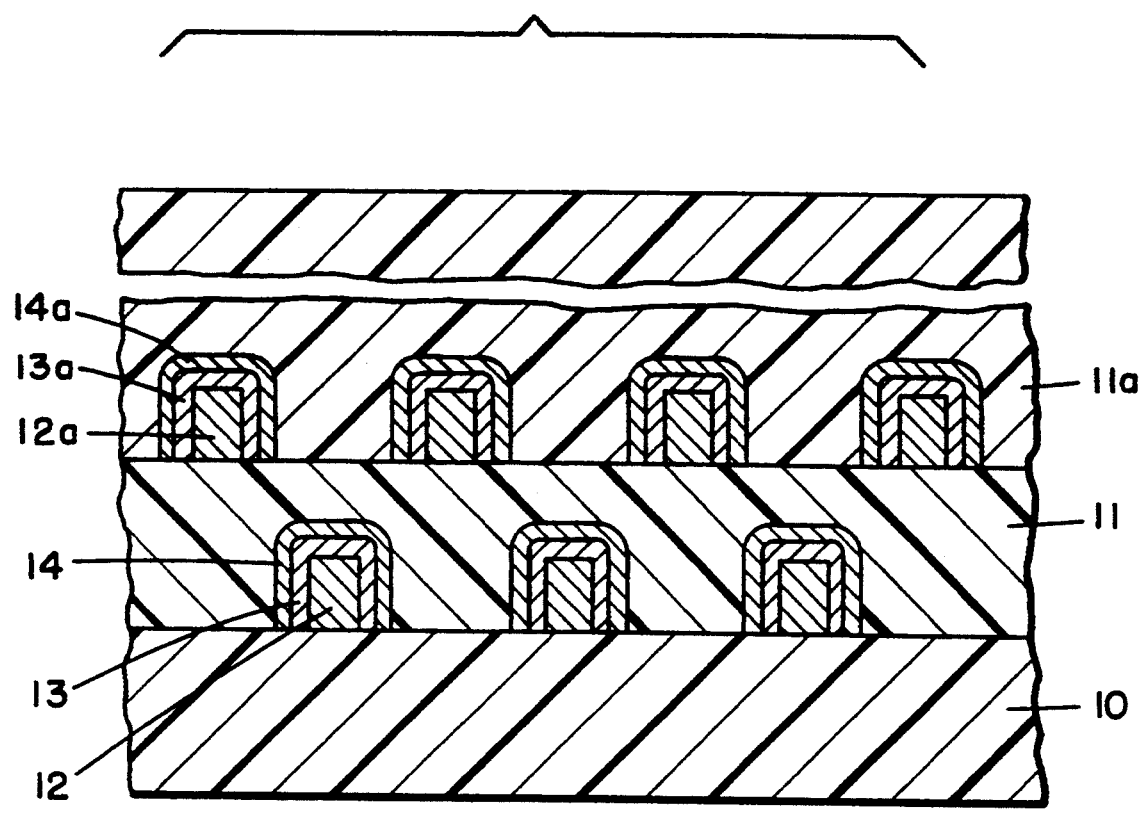
FIG. 1 is a partial cross sectional view of a laminar interconnect system of the invention. The Figure is not drawn to scale for the purposes of clarity.

With the exception of the step wherein an oxide layer of the capping metal is provided on the surface of the capping layer, the multilayer interconnect system of this invention may be prepared by conventional photoresist/etch techniques such as disclosed in U.S. Pat. No. 4,770,899, the complete disclosure of which is incorporated herein by reference.

Thus, and with reference to FIG. 1, a first substrate dielectric layer 10 is provided. This layer serves as the base upon which the multilayer interconnect is constructed. The substrate may be composed of a ceramic material such as a glass-ceramic, alumina, polycrystalline silicon, phosphorous-doped silicon dioxide or an insulating dielectric polymer such as a cured epoxy resin or a cured polyimide resin.

Next, a thin layer of a conductive metal is applied to the clean surface of substrate 10 by any suitable process such as sputtering or vapor deposition to yield a conductive film layer having a preferred thickness in the range of from about 0.5 to about 25 microns adhered to the substrate layer. Conductive metals which may be applied include copper, aluminum, silver, alloys thereof or successive layers of copper and chrome as is known in the art. The preferred conductive metal is copper.

In the next step, a layer of suitable positive or negative photoresist material is applied to the clean surface of the conductive metal layer and dried. The resist layer may be standard resist materials known in the art and may be positive acting or negative acting. The resists may be sensitive to near, mid and deep UV, electron beam, x-ray, ion beam or laser radiation. Examples of such resists include Novolak based resists containing light sensitive diazoquinone compounds such as disclosed in U.S. Pat. No. 4,550,069 or the so called blocked resists based on copolymers containing blocked imide groups and a latent photoacid, such as disclosed in U.S. Pat. No. 4,810,613. Also suitable are negative resists which contain photosensitive crosslinking agents or photopolymers such as disclosed in U.S. Pat. No. 3,469,982 and Re 30, 186.

The resist layer may be applied by any suitable process such as spin coating from solution, followed by drying. The thickness of the dried resist may range from about 1.0 to about 150 microns.

A circuit image of any desired pattern is next formed within the resist layer by exposure of the resist layer to radiation through an appropriate photographic mask or by controlled laser, ion beam or electron beam energy sources, followed by the usual development to remove the exposed or unexposed areas of the resist, depending on resist chemistry. The development step exposes that portion of the conductive metal layer surface to be etched away, while the remaining portions of the surface continue to be masked by the resist. Positive resist materials are preferred for this invention since they may be developed using aqueous alkaline developer materials such as alkali or alkaline earth metal hydroxide or metal-silicate aqueous solutions.

Next the resist-masked structure is contacted with a chemical etchant such as an acidic solution as is known in the art, which is effective to remove the exposed conductive metal down to the surface of support layer 10 while leaving the masked metal layers substantially intact. The remaining resist is then removed by dissolution using conventional aqueous or solvent based solutions.

The resulting etched structure comprises a circuit pattern of conductive metal lines 12 adhered to substrate 10, as shown in FIG. 1. The average density of the conductive metal lines may range from about 200 to about 10,000 lines per linear inch.

A capping layer is next selectively deposited on the surface of the pattern of conductive metal lines using electroless deposition techniques.

In accordance with such techniques, a catalytic surface for electroless deposition is created on the surface of the conductive metal lines by dipping, spraying or swabbing the surface of the structure prepared above at room temperature with a dilute aqueous solution, e.g., a 0.05N solution, of a catalytic metal salt, e.g. a platinum or palladium halide such as palladium chloride. This step activates the conductive metal for electroless deposition. After a contact time of up to about 10 minutes, the excess catalytic solution is washed away and the surface may be further treated by washing with dilute aqueous alkali solution, if necessary, which will selectively deactivate any catalytic metal which may have plated on the surfaces of substrate 10 which lie between conductive metal lines 12. This step will be necessary where support 10 is a polyimide resin since catalytic metal may adhere to this surface, resulting in the subsequent deposit of capping metal between conductive lines which will cause a shorting of the circuit.

The conductive metal lines present on the surface of the substrate are next selectively electrolessly plated with a heated aqueous solution of a suitable salt of the capping metal for a period of time sufficient to produce a layer of capping metal having a thickness of from about 0.02 to about 1.0 microns on the surface of the conductive metal lines, such as shown at 13 in FIG. 1. Generally, contact time with the aqueous capping metal salt solution may range from about 30 seconds to about 60 minutes and at temperatures in the range of from about 25° C. to about 95° C.

Suitable capping metals which can be electrolessly deposited by this method include cobalt, nickel, palladium and alloys of these metals such as cobalt-phosphorus or cobalt-boron alloys. Suitable salt forms of these metals include the water soluble sulfates or halides.

The next step in the process which forms the essence of this invention is the formation of a thin oxide layer on the surface of the capping metal and adhered to the surface of the capping metal layer, such as shown at 14 in FIG. 1. This layer may be formed by subjecting the capped metal structure as described above to oxidizing conditions to form a thin, adherent layer of the capping metal oxide on the surface of the capping metal layer. The identity of the oxide layer will depend on the identity of the capping metal and oxidation conditions. The preferred oxide layer may be cobalt oxide, cobaltous oxide or the more strongly adherent tricobalt tetraoxide ($Co_3O_4$) or combinations thereof; nickelic oxide ($Ni_2O_3$), nickel oxide or a combination thereof; and palladium oxide.

A suitable oxidative condition for formation of the oxide layer can be achieved in a controlled way by heating the capped structure in a water saturated atmosphere in an oven at temperatures of from about 125° C. to about 225° C., preferably from about 150° C. to 200° C., and in the presence of air or oxygen for a period of from about 5 to about 60 minutes. The degree of oxidation can be more precisely controlled by using a circulating mixture of gases, e.g. nitrogen and oxygen, where the content of oxygen in the mixture ranges from about 2 to about 6 volume %.

Yet another technique for oxidation of the capping metal surface involves immersion of the capped structures in a buffered alkali solution such as an alkali or ammonium hydroxide or carbonate, containing a suitable buffer such as a borate salt, at a pH of from about 9 to 11, preferably from about 9.6 to 10, maintained at a temperature of from about 50° C. to about 75° C., preferably from about 60° C. to about 70° C., for a period of time ranging from about 2 to about 25 minutes.

Oxidation conditions are preferably such that a layer of adherent oxide having a thickness of about 50 to about 150 Angstroms is formed.

After the oxidation treatment, the resulting oxide coated, capped structure is washed and dried, and then a thin, uniform coating of a polyimide precursor is applied to the surface of the substrate to overcoat both the substrate and the circuit pattern adhered thereto. Especially preferred polyimide precursors are polyamic acid polymers which are the condensation products of aromatic dianhydrides with diamines, more preferably aromatic diamines. Suitable aromatic dianhydrides include pyromellitic dianhydride; 2,2-bis(3,4-dicarboxyphenyl)propane dianhydride; 2,3,6,7-naphthalenetetracarboxylic dianhydride; 2,2',3,3'-diphenyltetracarboxylic dianhydride and benzophenone tetracarboxylic dianhydride. Suitable diamines include m-phenylene diamine, p-phenylene diamine and 4,4'-diaminodiphenyl ether. The polyamic acids may be partially imidized such as by heat or chemical cyclization as a method for controlling the number of free acid groups present in the polymer molecule.

Suitable polyamic acids useful for the purpose of this invention generally have glass transition temperatures (Tg) in excess of 200° C. and their methods of preparation are disclosed in U.S. Pat. Nos. 3,179,614; 3,264,250 and 3,310,573, the disclosure of which references is incorporated herein by reference. Particularly preferred polyamic acid polymers are available from the DuPont Company under the trade designation RC-5878 and PI 5057.

The polyamic acid layer may be formed in any conventional fashion. Typically it is applied as a film or by spin coating a solution of the polymer dissolved in suitable inert solvent such as N-methylpyrrolidone, and dried.

After drying, the polyamic acid layer is cured to the polyimide stage by heating the coated structure to temperatures in the order of from about 120° C. to about 450° C., preferably from 160° C. to 400° C., to form a cured polyimide layer having a thickness in the range of from about 1.0 to about 25 microns. Such a cured polyimide layer is shown at 11 in FIG. 1, overcoating and adjacent to capping metal oxide layer 14 and free areas of substrate 10.

A multilayer, laminar interconnect package may then be constructed by forming a second circuit pattern of conductive metal lines on the surface of polyimide layer 11 by the resist/etch method described above, and subjecting the assembly to the capping, oxidation and further polyamic acid overcoat and cure steps as described above to yield a second tier of the laminar structure of polyimide 11a, conductive metal lines 12a, capping metal coating 13a and oxide coating 14c as shown in FIG. 1. This process may be repeated from 1 to about 12 times to yield highly dense, multilayer laminar interconnect packages suitable for use in the fabrication of high speed integrated circuits.

The improved adhesion properties of the oxide layer and polyimide layers are demonstrated by the following test. A film of cobalt metal was immersed in an aqueous solution of sodium hydroxide containing a borate buffer and having a pH of about 9.8. The temperature of the solution was about 65° C. and the time of immersion was 10 minutes. The film was removed from the solution, washed and dried. The resulting film had an oxide layer having a thickness of about 100 Angstroms with a chemical structure similar to $Co_3O_4$ as determined by X-ray Photoelectron Spectroscopy.

The film as prepared above and an untreated control film having a thin, discontinuous coating (less than 20 Angstroms) of native cobalt oxide were evaluated for polyimide adhesion by applying a coating of polyamic acid on the surfaces, drying and heat curing the polyamic acid (400° C.) to form a cured polyimide film having a thickness of about 15 microns. The samples were cut into strips and peel strength was evaluated using an Instron testing machine. The film treated in accordance with this invention exhibited an average 90° angle peel strength of 45–55 g/mm whereas the control exhibited an average 90° angle peel strength of <10 g/mm.

It is to be understood that the particular processing steps set forth herein and in the claims may include other steps conducted between the sequences set forth such as etching steps to provide connective vias and like steps as are well known in the art.

What is claimed is:

1. A process for fabricating a multilayer interconnect package comprising conductor circuit layers separated by and adhered to polyimide dielectric layers comprising:
   a) forming a circuit pattern of conductive metal lines on a substrate;
   b) electrolessly depositing a capping metal layer on the surface of said pattern of conductive metal lines, said capping metal characterized as being essentially chemically inert when in contact with polyimide precursor;
   c) subjecting said capping metal layer to oxidative conditions to form a layer of capping metal oxide adhered to the surface of said capping layer;

d) forming a uniform coating of polyimide precursor material on a planar surface of said substrate to overcoat said substrate and said circuit pattern, thereby forming a laminar structure; and e) heating said laminar structure to cure said polyimide precursor material, thereby forming a polyimide surface.

2. The process of claim 1 further including the steps of:

f) forming a second circuit pattern of conductive metal lines on the polyimide surface of said laminar structure produced in step (e); and g) repeating steps (b) through (e).

3. The process of claim 2 wherein said conductive metal is copper.

4. The process of claim 3 wherein said capping metal is selected from the group consisting of cobalt, nickel, palladium and alloys thereof.

5. The process of claim 4 wherein said capping metal is cobalt or an alloy of cobalt with phosphorus or boron.

6. The process of claim 5 wherein the oxide formed on the surface of said capping metal comprises tricobalt tetraoxide.

7. The process of claim 4 wherein said oxidative conditions comprise immersion of the structure produced in step (b) in a buffered aqueous basic solution at a pH of from about 9 to 11 for a period of from about 2 to 25 minutes and at a temperature of from about 50° C. to 75° C.

8. The process of claim 7 wherein said solution contains a borate buffer.

9. The process of claim 7 wherein the pH of said solution ranges from about 9.6 to 10.

10. The process of claim 4 wherein said oxidative conditions comprise heating the structure produced in step (b) in a water saturated atmosphere in the presence of air or oxygen at a temperature of from about 125° C. to about 225° C.

11. The process of claim 2 wherein said polyimide precursor is a polyamic acid.

12. The process of claim 11 wherein said substrate in step (a) is a ceramic or polyimide dielectric layer.

13. The process of claim 2 wherein steps (f) and (g) are repeated at least 1 to about 12 times to form a multilayer interconnect system.

14. A process for fabricating a multilayer interconnect system comprising conductor circuit layers separated by and adhered to polyimide dielectric film layers comprising:

a) forming a circuit pattern of copper metal lines on a polyimide film substrate;

b) electrolessly depositing a capping layer of cobalt or cobalt alloy on the surface of said copper metal lines;

c) oxidizing said capping layer to form a layer of a cobalt oxide adhering to the surface of said cobalt or cobalt alloy, said capping layer having a thickness of from about 50 to about 150 Angstroms;

d) forming a layer of polyamic acid on the surface of said polyimide film substrate to overcoat said substrate and said circuit pattern, thereby forming a laminar structure; and e) heating said laminar structure to cure said polyamic acid, thereby forming a second polyimide surface.

15. The process of claim 14 including the additional steps of:

f) forming a second circuit pattern of copper metal lines on said second polyimide surface; and g) repeating steps (b) through (e).

16. The process of claim 15 wherein steps (f) and (g) are repeated at least 1 to about 12 times to form a multilayer interconnect system.

* * * * *